(12) United States Patent
Kim

(10) Patent No.: US 10,741,728 B2
(45) Date of Patent: Aug. 11, 2020

(54) MICRO-LED DISPLAY DEVICE AND METHOD OF FABRICATING THE SAME

(71) Applicant: LG DISPLAY CO., LTD., Seoul (KR)

(72) Inventor: Keun-Young Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/042,550

(22) Filed: Jul. 23, 2018

(65) Prior Publication Data

US 2019/0066592 A1 Feb. 28, 2019

(30) Foreign Application Priority Data

Aug. 30, 2017 (KR) ........................ 10-2017-0110017

(51) Int. Cl.

| | |
|---|---|
| H01L 33/48 | (2010.01) |
| G09G 3/32 | (2016.01) |
| H01L 25/075 | (2006.01) |
| H01L 51/00 | (2006.01) |
| H01L 27/12 | (2006.01) |
| H01L 33/54 | (2010.01) |
| H01L 33/20 | (2010.01) |
| H01L 33/62 | (2010.01) |

(52) U.S. Cl.
CPC .............. *H01L 33/486* (2013.01); *G09G 3/32* (2013.01); *H01L 25/0753* (2013.01); *H01L 27/1214* (2013.01); *H01L 33/54* (2013.01); *H01L 51/003* (2013.01); *G09G 2300/0426* (2013.01); *H01L 33/20* (2013.01); *H01L 33/62* (2013.01)

(58) Field of Classification Search
CPC ............. G09G 3/32; G09G 2300/0426; G02B 6/0031; H01L 21/02107; H01L 27/1203; H01L 27/3276; H01L 25/0753; H01L 27/1214; H01L 51/003; H01L 33/20; H01L 33/62; H01L 27/15; H01L 27/153; H01L 27/156; H01L 27/12; H01L 27/1207; H01L 25/167; H01L 33/486
See application file for complete search history.

(56) References Cited

U.S. PATENT DOCUMENTS

| | | | |
|---|---|---|---|
| 2016/0260872 A1* | 9/2016 | Butterworth | ............ H01L 33/60 |
| 2018/0138157 A1* | 5/2018 | Im | ............ H01L 33/52 |
| 2018/0342555 A1* | 11/2018 | Chen | ............ H01L 27/153 |

* cited by examiner

*Primary Examiner* — Scott B Geyer
(74) *Attorney, Agent, or Firm* — Birch, Stewart, Kolasch & Birch, LLP

(57) ABSTRACT

A micro-LED display device includes a substrate; a first insulating layer on the substrate and including a first region and a second region; and a micro-LED in the first region, wherein the first region has a first hydrophilicity, and the second region has a second hydrophilicity that is less than the first hydrophilicity.

11 Claims, 7 Drawing Sheets

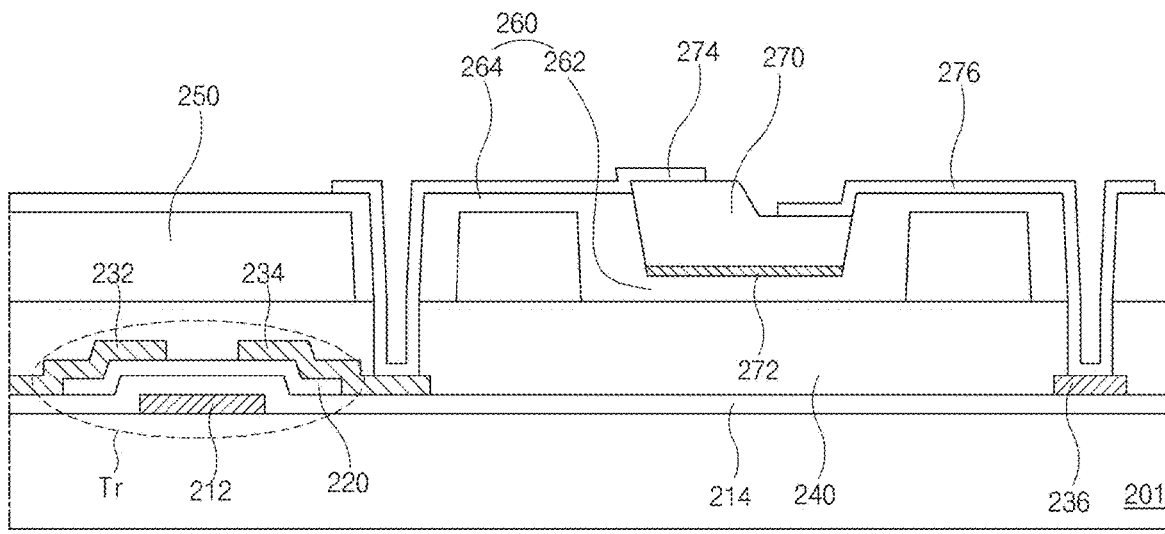

MICRO-LED DISPLAY DEVICE AND METHOD OF FABRICATING THE SAME

CROSS-REFERENCE TO RELATED APPLICATION

This application claims priority to and the benefit of Republic of Korea Patent Application No. 10-2017-0110017 filed in the Republic of Korea on Aug. 30, 2017, which is hereby incorporated by reference in its entirety.

BACKGROUND OF THE INVENTION

Field of the Invention

Embodiments of the invention relate to a display device, and more particularly, to a micro-LED display device and a method of fabricating the same having high production yield.

Discussion of the Related Art

As the size of the display device becomes larger, the requirement of a flat panel display device having increased resolution is increased. For example, a liquid crystal display (LCD) device and an organic electroluminescent display device including an organic light emitting diode as the flat panel display device are rapidly developed.

In the LCD device, a backlight unit is disposed under a liquid crystal panel, where a polarization plate is attached on a rear surface and a front surface, and the LCD device can have the transmittance of about 5% with respect to the light from the light source in the backlight unit. Accordingly, there is a disadvantage in an optical efficiency of the LCD device being low.

The organic electroluminescent display device has an optical efficiency being greater than that of the LCD device. However, there is still a limitation in the optical efficiency of the organic electroluminescent display device. In addition, there are disadvantages in the durability and/or the lifespan of the organic electroluminescent display device.

Recently, to overcome the problems of the LCD device and the electroluminescent display device, a micro-light emitting diode (micro-LED) display device is introduced. In the micro-LED display device, a subminiature LED, which has a size being less than about 100 micrometers, is disposed in each pixel to display an image. The micro-LED display device has advantages in the power consumption and the miniaturization.

In the micro-LED display device, the micro-LED, which can be referred to as an inorganic LED (iLED) or a crystal LED, is disposed in each pixel. The micro-LED, which is grown on a wafer, is transferred on an array substrate of the display device by using a stamp.

However, the transfer process of thousands or tens of thousands micro-LEDs is very complicated, and the yield of the transfer process is significantly low. Accordingly, the production yield of the micro-LED display device is decreased.

SUMMARY OF THE INVENTION

Accordingly, embodiments of the invention are directed to a micro-LED display device and a method of fabricating the same that substantially obviate one or more of the problems due to limitations and disadvantages of the related art, and have other advantages.

Additional features and advantages of the invention will be set forth in the description which follows, and in part will be apparent from the description, or can be learned by practice of the invention. The objectives and other advantages of the invention will be realized and attained by the structure particularly pointed out in the written description and claims hereof as well as the appended drawings.

Embodiments relate to a micro-LED display device including a substrate; a first insulating layer on the substrate and including a first region and a second region; and a micro-LED in the first region, wherein the first region has a first hydrophilicity, and the second region has a second hydrophilicity that is less than the first hydrophilicity.

Embodiments also relate to a method of fabricating a micro-LED display device including forming an insulating layer on a substrate; irradiating a UV ray to the insulating layer; transferring a micro-LED on a stamp onto the insulating layer by contacting the micro-LED to the insulating layer; and separating the stamp from the micro-LED.

Embodiments also relate to a method of fabricating a micro-light emitting diode (micro-LED) display device including arranging a stamp over a wafer including a micro-LED; irradiating a UV ray on the stamp to increase a hydrophilicity of the stamp; transferring the micro-LED to the stamp by contacting the stamp with the micro-LED; arranging the stamp with the micro-LED over a substrate; irradiating a visible-ray to the stamp to decrease the hydrophilicity of the stamp; and transferring the micro_LED to the substrate.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 7A to 7D are schematic cross-sectional views illustrating a fabricating process of the micro-LED display device according to the second example embodiment.

FIG. 8 shows Table 2 depicting measured water ($H_2O$) contact angle of a hydrophilicity changeable layer according to an embodiment of the present invention.

DETAILED DESCRIPTION OF THE EMBODIMENTS

As mentioned above, thousands or tens of thousands micro-LEDs should be transferred onto an array substrate of the micro-LED display device. In this instance, a plurality of micro-LEDs should be transferred at the same time.

However, in the transfer process, some micro-LEDs on the wafer are not transferred onto the stamp, and/or some micro-LEDs on the stamp are not transferred onto the array substrate. Accordingly, the production yield of the micro-LED display device is lowered.

Reference will now be made in detail to embodiments of the invention, examples of which are illustrated in the accompanying drawings.

Figure 1:
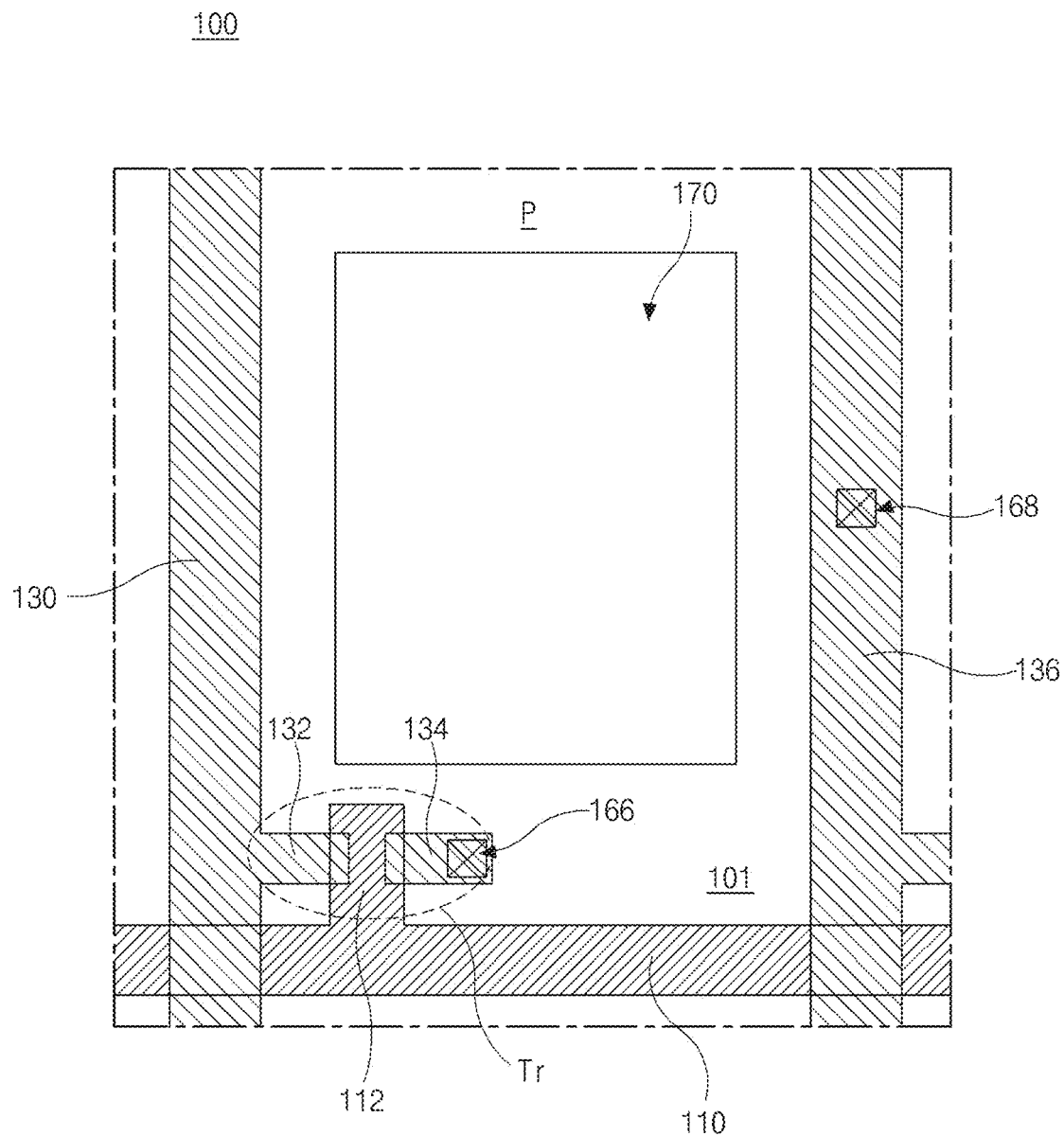
FIG. 1 is a schematic plane view of a micro-LED display device according to an embodiment of the present invention.

FIG. 1 is a schematic plane view of a micro-LED display device according to an embodiment of the present invention. All the components of the micro-LED display device according to all embodiments are operationally coupled and configured.

As shown in FIG. 1, the micro-LED display device 100 includes a plurality of thin film transistors (TFT) Tr on a first substrate 101 and a plurality of micro-LEDs 170 connected to the plurality of TFTs Tr.

The first substrate 101 can be a glass substrate or a plastic substrate. For example, the first substrate 101 can be formed of polyimide.

A gate line 110 and a data line 130, which cross each other to define a pixel region P, are formed on the first substrate 101. In addition, a common voltage line 136, which can be parallel to and spaced apart from the data line 130, can be formed on the first substrate 130. It is to be understood that the micro-LED display device 100 includes a plurality of gate lines 110 and a plurality of data lines 130 that define a plurality of pixel regions P. Each of the plurality of pixel regions include one or more thin film transistors (TFT) Tr, and other components.

The TFT Tr includes a gate electrode 112, a semiconductor layer, a source electrode 132 and a drain electrode 134 and is connected to the gate line 110 and the data line 130. Namely, the gate electrode 112 is connected to the gate line 110, and the source electrode 132 is connected to the data line 130.

The micro-LED 170 is positioned in the pixel region P and is connected to the drain electrode 134 and the common voltage line 136. For example, an insulating layer, which includes a drain contact hole 166 exposing the drain electrode 134 and the common contact hole 168 exposing the common voltage line 136, can be formed on the TFT Tr and the common voltage line 136, and the micro-LED 170 can be formed on the insulating layer to be connected to the drain electrode 134 and the common voltage line 136 through the drain contact hole 166 and the common contact hole 168, respectively.

In the micro-LED display device 100, at least one micro-LED 170 is formed in each pixel region P to emit the light, and there are advantages in the brightness, the power consumption, the lifespan, and so on. For example, one red micro-LED, one green micro-LED and one blue micro-LED can be disposed in three adjacent pixel regions P. Alternatively, the red micro-LED, the green micro-LED and the blue micro-LED can be disposed in one pixel region P.

In addition, as described below, the transfer process of the micro-LED can be performed by using a hydrophilic-hydrophobic changeable material by a UV ray and visible ray irradiation such that the production yield of the micro-LED display device 100 is improved and the production cost of the micro-LED display device 100 is reduced.

Figure 2:
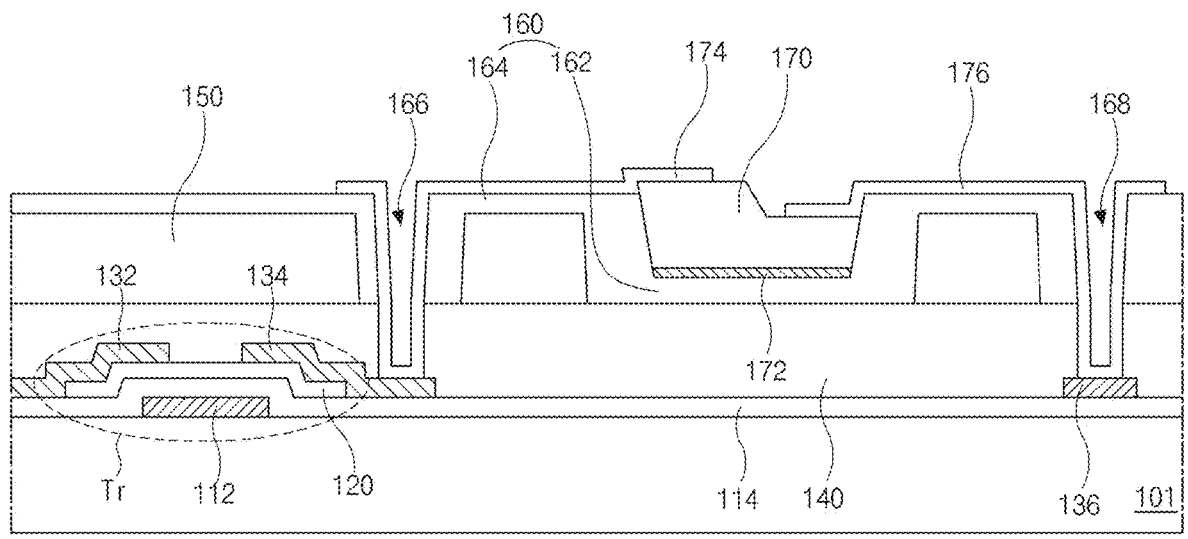
FIG. 2 is a schematic cross-sectional view of a micro-LED display device according to a first example embodiment of the present invention.

FIG. 2 is a schematic cross-sectional view of a micro-LED display device according to a first example embodiment of the present invention, and FIGS. 3A to 3D are schematic cross-sectional views illustrating a fabricating process of the micro-LED display device according to the first example embodiment.

As shown in FIG. 2 depicting the schematic cross-sectional view of the micro-LED display device of FIG. 1 from the TFT Tr through a common contact hole 168, the micro-LED 170 is positioned over the first substrate 101, and the TFT Tr is positioned between the first substrate 101 and the micro-LED 170.

A second substrate, which can be attached to the first substrate 101, can be disposed over the micro-LED 170.

A gate electrode 112 is formed on the first substrate 101. The gate electrode 112 is connected to the gate line 110 (of FIG. 1). For example, each of the gate line 110 and the gate electrode 112 can be formed of a low resistance metallic material, e.g., aluminum or copper. Other materials can be used.

A gate insulation layer 114 can be formed over an entire surface of the first substrate 101 to cover the gate line 110 and the gate electrode 112. For example, the gate insulating layer 114 can be formed of an inorganic insulating material, e.g., silicon oxide or silicon nitride.

A semiconductor layer 120 corresponding to the gate electrode 112 can be formed on the gate insulating layer 114. For example, the semiconductor layer 120 can be formed of an oxide semiconductor material. Alternatively, the semiconductor layer 120 can have a double-layered structure including an active layer of intrinsic amorphous silicon and an ohmic contact layer of an n-type impurity-doped amorphous silicon.

A source electrode 132, which is connected to the data line 130 (of FIG. 1), is formed on the semiconductor layer 120. In addition, a drain electrode 134, which is spaced apart from the source electrode 132, is formed on the semiconductor layer 120. For example, each of the data line 130, the source electrode 132 and the drain electrode 134 can be formed of a low resistance metallic material, e.g., aluminum or copper. Other materials can be used.

The common voltage line 136, which is spaced apart from and parallel to the data line 130, is formed on the gate insulating layer 114. Alternatively, the common voltage line 136 can be spaced apart from and parallel to the gate line 110. In this instance, the common voltage line 136 can be formed on the same layer as the gate line 110.

The gate electrode 112, the semiconductor layer 120, the source electrode 132 and the drain electrode 134 constitute the TFT Tr.

In the TFT Tr, the gate electrode 112 can be positioned under the semiconductor layer 120, and the source and drain electrodes 132 and 134 are positioned over the semiconductor layer 120. Namely, the TFT Tr has an inverted staggered structure.

Alternatively, the gate electrode, the source electrode, and the drain electrode can be positioned over the semiconductor layer such that the TFT can have a coplanar structure.

A first insulating layer 140 can be formed to cover the TFT Tr, and second and third insulating layers 150 and 160 can be sequentially formed on the first insulating layer 140. A drain contact hole 166, which exposes a portion of the drain electrode 134, and a common contact hole 168, which exposes a portion of the common voltage line 136, can be formed through the first and third insulating layers 140 and 160.

The second insulating layer 150 can be formed at a part of the pixel region P to increase a height (or thickness) of the third insulating layer 160. Namely, the second insulating layer 150 can be positioned between the first and third insulating layers 140 and 160 and covers a lateral side of the micro-LED 170. The second insulating layer 150 can be spaced apart from the micro-LED 170.

Since the micro-LED 170 is pressurized or pressed and attached onto the third insulating layer 160 by the transfer process, the third insulating layer 160 can be formed by coating a low viscosity material. First and second connection lines 174 and 176 respectively connecting the micro-LED 170 to the drain electrode 134 and the common voltage line 136 can be formed on the third insulating layer 160. To prevent or reduce the disconnection of the first and second connection lines 174 and 176 by a step difference between the micro-LED 170 and the third insulating layer 160, a first region 162 of the third insulating layer 160 can have a relatively small height and a second region 164 of the third insulating layer 160 can have a relatively large height.

In the present invention, since the second insulating layer 150 can be formed to cover the lateral side of the micro-LED 170, a height of the second portion 164 of the third insulating layer 160 can be increased due to the thickness of the second insulating layer 150. Accordingly, the disconnection problem of the first and second connection lines 174 and 176 can be prevented or reduced. However, the second insulating layer 150 can be omitted.

The third insulating layer 160 can be formed of an organic insulating material, e.g., photo-acryl, and has a height difference in the pixel region P.

Namely, in the third insulating layer 160, the first region 162, which can correspond to a center of the pixel region P, has a first height from the first substrate 101, and the second region 164, which can correspond to an edge of the pixel region P, has a second height, which can be greater than the first height, from the substrate 101.

The micro-LED 170 can be formed on the first region 162 of the third insulating layer 160. In this instance, the height difference between the first and second portions 162 and 164 can be substantially equal to a thickness of the micro-LED 170. As a result, a portion of the micro-LED 170 and the second portion 164 can provide a flat top surface.

Figure 3A:
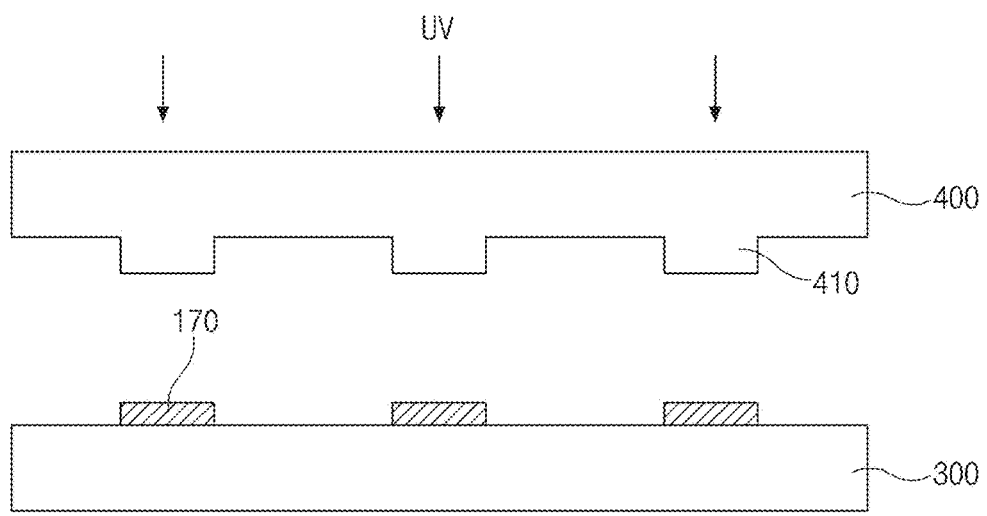
FIGS. 3A to 3D are schematic cross-sectional views illustrating a fabricating process of the micro-LED display device according to the first example embodiment.

Referring to FIG. 3A, a stamp 400 optionally including at least one protrusion 410 can be disposed over a wafer 300 on which the micro-LED 170 can be grown or fabricated. For example, the stamp 400 can be formed of a rubber material, e.g., polydimethylsiloxane (PDMS) and includes a hydrophilicity changeable material, which is represented by Formula 1, therein. The stamp 400 can be other materials that provide support for the micro-LED 170. Also, the stamp 400 need not include the at least one protrusion 410 to correspond to the micro-LED 170. For example, the micro-LED 170 can be seated in a recess on a surface of the stamp 400, or the stamp 400 can include a holding structure to hold the micro-LED 170. The sizes or dimensions of the structure, such as the protrusion 410 or a recess can be about the same as a size or a dimension of the micro-LED 170, but such is not required. If multiple-sized or different sized micro-LED 170 are used, the holding structure of the stamp 400 can be varied to accommodate the sizes of the micro-LED 170. The holding structure of the stamp 400 can be arranged in one of a regular interval, in a specific arraignment, and a pattern that can be each suitable with the arrangement of an array of micro-LEDs 170.

Alternatively, the hydrophilicity changeable material can be coated on a surface of the stamp 400. Namely, the hydrophilicity changeable material can be coated on the protrusion side surface, but such is not required. The stamp 400 includes a base layer and a hydrophilicity changeable layer on the base layer. The hydrophilicity of the hydrophilicity changeable layer is increase by a UV ray irradiation and decreased by visible-ray irradiation. In embodiments of the invention, the hydrophilicity changeable layer can be formed locally in disconnected arrangement, either at the holding structure or directly on a surface of the stamp 400.

[Formula 1]

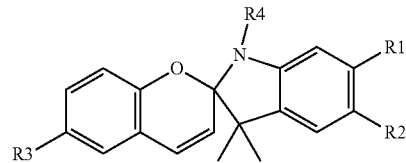

In Formula 1, R1 and R2 are hydrogen or combined to each other to form a fused ring. R3 can be selected from an electron withdrawing group. For example, R3 can be selected from —$NO_2$, —COH, —COOH and —CN. R4 can be selected from methacrylamide group, alkoxy group, acryl group, epoxy group, amide group, vinyl group.

Namely, the hydrophilicity changeable material can be a pyran-based compound and can be a material of Formula 2.

[Formula 2]

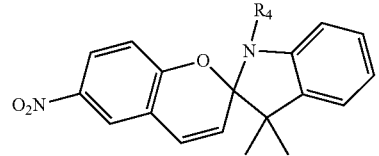

R4 in Formula 2 can be the same as that in Formula 1. Namely, R4 can be selected from methacrylamide group, alkoxy group, acryl group, epoxy group, amide group, vinyl group.

Figure 4:
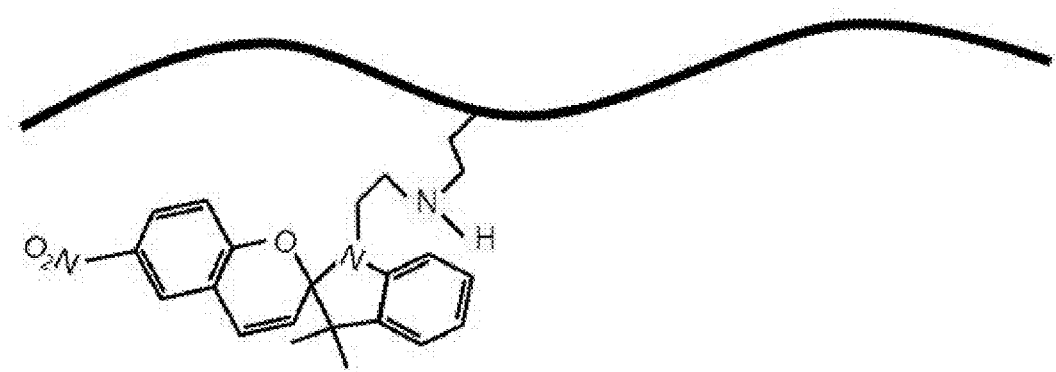
FIG. 4 is a schematic view illustrating a structure of a pyran compound connected to a base matrix.

The hydrophilicity changeable material can be dispersed in a rubber base matrix, e.g., PDMS, or can be coated on the surface of the stamp 400. In addition, as shown in FIG. 4, which is a schematic view illustrating a structure of a pyran compound connected to a base matrix, the pyran-based compound can be connected to the base matrix as a side chain.

Referring again to FIG. 3A, the UV ray is irradiated onto the stamp 400, such as one surface of the stamp 400. The UV ray can have a wavelength of about 300 to 400 nm, and can be 365 nm. When the UV ray is irradiated onto the stamp 400, the hydrophilicity of the stamp 400 is increased such that one or more surfaces of the stamp 400 has or obtains a hydrophilic property. Accordingly, the adhesion strength between the stamp 400 and the micro-LED 170 is increased thereby.

Figure 5:
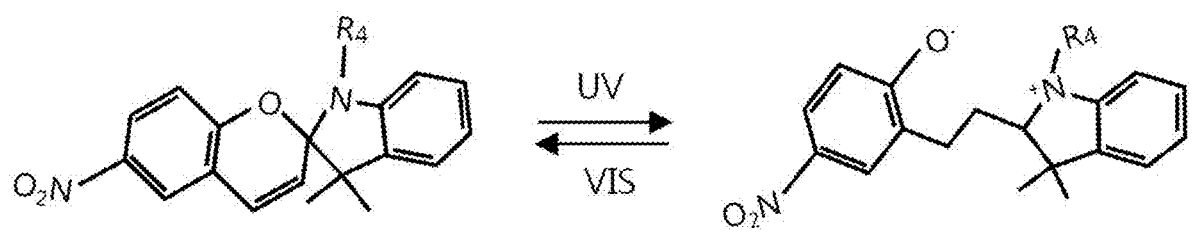
FIG. 5 is a schematic view illustrating a property changing mechanism of a pyran compound by light irradiation.

Referring to FIG. 5, which is a schematic view illustrating a property changing mechanism of a pyran compound by light irradiation, a ring of a pyran moiety of the pyran-based compound, which has a hydrophobic property, is opened by UV ray irradiation such that the hydrophilic property is provided. On the other hand, the ring is closed by visible-ray irradiation such that the hydrophobic property is provided. In this instance, the electron of a nitrogen atom is easily withdrawn by the electron withdrawing group, e.g., R3 in Formula 1, such that the ring of the pyran moiety is easily opened.

In other words, by the UV ray irradiation, the hydrophilic property of the hydrophilicity changeable material is increased, and the hydrophobic property of the hydrophilicity changeable material is decreased. On the other hand, by visible-ray irradiation, the hydrophilic property of the hydrophilicity changeable material is decreased, and the hydrophobic property of the hydrophilicity changeable material is increased.

Figure 3B:
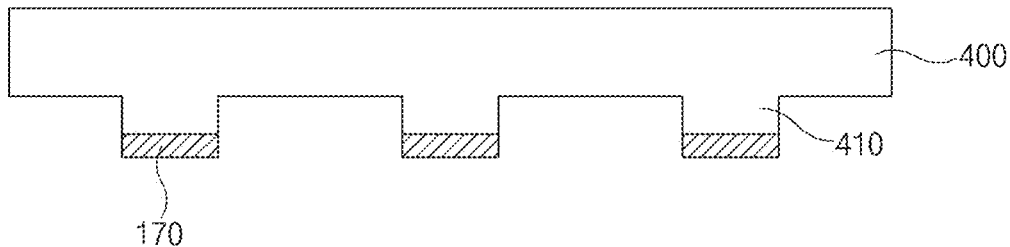

Accordingly, when the stamp 400, on which the UV ray is irradiated, contacts the micro-LED 170, the micro-LED 170 is easily or efficiently transferred from the wafer 300 to stamp 400 as shown in FIG. 3B.

Figure 3C:
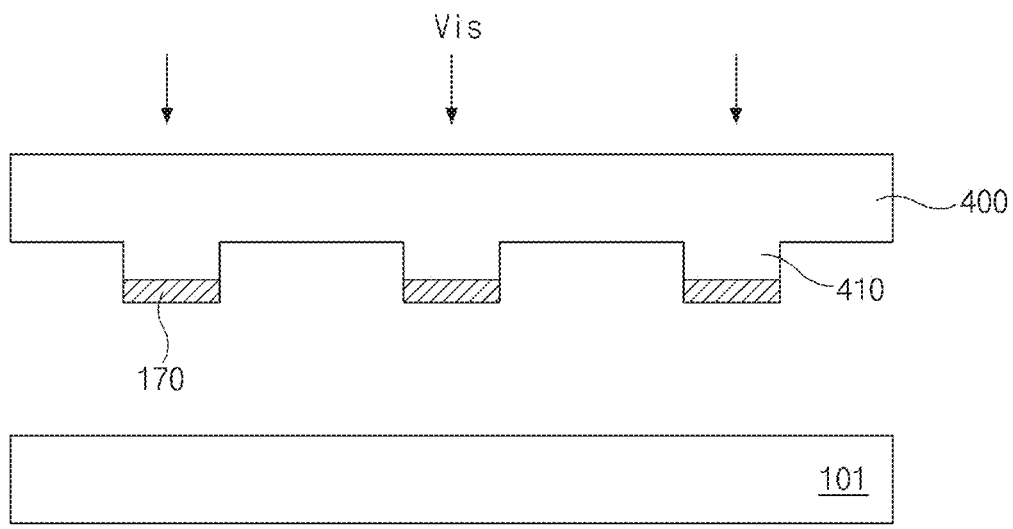

Next, as shown in FIG. 3C, the stamp 400, where the micro-LED 170 is transferred on the protrusion 410, is disposed over the first substrate 101, where the third insulating layer 160 (of FIG. 2) is formed, the visible-ray "Vis" is irradiated onto an upper surface, i.e., the protrusion-opposite side, of the stamp 400.

As a result, the hydrophobic property of the surface of the stamp 400 is increased such that the adhesion strength between the stamp 400 and the micro-LED 170 is decreased.

Figure 3D:
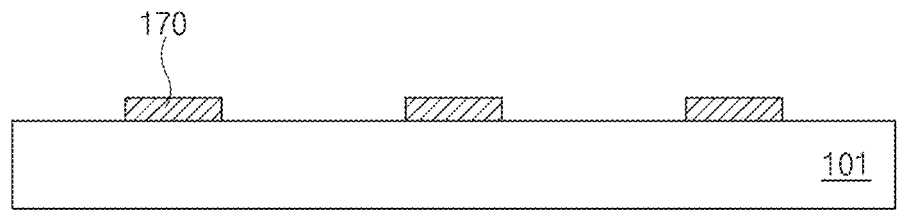

Next, by contacting the micro-LED 170 to the first substrate 101, the micro-LED 170 is easily or efficiently transferred from the stamp 400 to the first substrate 101 as shown in FIG. 3D.

The PDMS stamp, where the hydrophilicity changeable material is coated, "Ex1" and the PDMS stamp, where hydrophilicity changeable material is mixed, "Ex2" are prepared. The hydrophilicity changeable material of Formula 2, where R4 can be a methacrylamide group, can be used. The transfer ratio of the micro-LED from the wafer to the stamp according to the UV ray irradiation is measured and listed in Table 1.

TABLE 1

| Ex1 | | Ex2 | |
| --- | --- | --- | --- |
| UV (365 nm) amount | transfer ratio (transfer/initial) | UV (365 nm) amount | transfer ratio (transfer/initial) |
| 50 mJ | 80/100 | 50 mJ | 80/100 |
| 150 mJ | 95/100 | 150 mJ | 90/100 |
| 200 mJ | 100/100 | 200 mJ | 95/100 |
| 250 mJ | 100/100 | 250 mJ | 100/100 |
| 300 mJ | 100/100 | 300 mJ | 100/100 |

As shown in Table 1, the transfer ratio of the micro-LED is improved by the UV ray irradiation, and there can be no difference in coating and mixing the hydrophilicity changeable material.

Referring again to FIG. 2, the micro-LED 170 is positioned in the first region 162 of the third insulating layer 160 in the pixel region P. The micro-LED 170 can include an anode and a cathode, which faces the anode, an active layer as an emitting part between the anode and the cathode, and a reflection plate 172 under the active layer. The light emitted from the active layer is reflected by the reflection plate 172 such that the optical efficiency of the micro-LED display device 100 is improved.

The reflection plate 172 can be a separation element from the anode or the cathode. Alternatively, the anode or the cathode can be formed of a reflective material to serve as the reflection plate 172.

The micro-LED 170 is connected to the drain electrode 134 of the TFT Tr through the first connection line 174, which is connected to the anode, and the common voltage line 136 through the second connection line 176, which is connected to the cathode.

Namely, the first and second connection lines 174 and 176 are disposed on the third insulating layer 160 and in the second region 164 of the third insulating layer 160. In addition, one end of the first connection line 174 is connected to the anode of the micro-LED 170, and the other end of the first connection line 174 is connected to the drain electrode 134 of the TFT Tr through the drain contact hole 166. One end of the second connection line 176 is connected to the cathode of the micro-LED 170, and the other end of the second connection line 176 is connected to the common voltage line 136 through the common contact hole 168.

Accordingly, the voltage of the data line 130 is applied to the anode of the micro-LED 170 through the TFT Tr, and the voltage of the common voltage line 136 is applied to the cathode of the micro-LED 170. As a result, the emission of the micro-LED 170 is generated, and the micro-LED display device 100 provides an image.

As mentioned above, in the present invention, the micro-LED 170 is transferred by using the stamp 400, where the hydrophilicity changeable material is coated or mixed, such that the transfer efficiency of the micro-LED 170 is improved. As a result, the production yield of the micro-LED display device 100 is improved, and the production cost of the micro-LED display device 100 is reduced.

However, in the micro-LED display device 100 according to the first embodiment, an adhesion strength between the micro-LED 170 and the third insulating layer 160 over the first substrate 101 can be bad such that a separation problem (detaching problem) of the micro-LED 170 can be caused.

Namely, since the third insulating layer 160, which can be formed of an organic insulating material, can have a hydrophobic property, there can be a problem in the adhesion strength between the hydrophilic micro-LED 170 and the hydrophobic third insulating layer 160.

Figure 6:
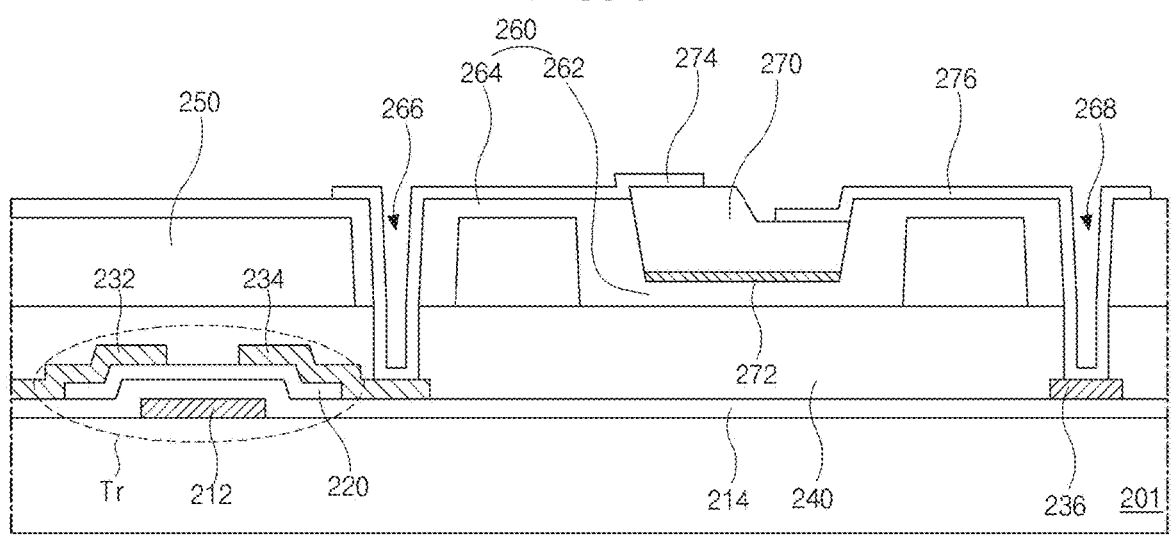
FIG. 6 is a schematic cross-sectional view of a micro-LED display device according to a second example embodiment of the present invention.

FIG. 6 is a schematic cross-sectional view of a micro-LED display device according to a second example embodiment of the present invention. All the components of the micro-LED display device according to all embodiments are operationally coupled and configured.

As shown in FIG. 6, a micro-LED 270 is positioned over a first substrate 201, and a TFT Tr is positioned between the first substrate 201 and the micro-LED 270. It is to be understood that the micro-LED display device according to the second example embodiment also includes a plurality of gate lines and a plurality of data lines that define a plurality of pixel regions. Each of the plurality of pixel regions include one or more thin film transistors (TFT), and other components A second substrate, which can be attached to the first substrate 201, can be disposed over the micro-LED 270.

The TFT Tr can include a gate electrode 212, a semiconductor layer 220, a source electrode 232 and a drain electrode 234. In addition, a gate line and a data line, which cross each other, are formed on the first substrate 101, and a common voltage line 236 is formed to be spaced apart from and parallel to the data line.

A first insulating layer 240 can be formed to cover the TFT Tr, and second and third insulating layers 250 and 260 are sequentially formed on the first insulating layer 240. A drain contact hole 266, which exposes a portion of the drain electrode 234, and a common contact hole 268, which exposes a portion of the common voltage line 236, are formed through the first and third insulating layers 240 and 260.

The second insulating layer 250 can be formed at a part of the pixel region P to increase a height (or thickness) of the third insulating layer 260. Namely, the second insulating layer 250 can be positioned between the first and third insulating layers 240 and 260 and covers a lateral side of the micro-LED 270. The second insulating layer 250 can be spaced apart from the micro-LED 270.

Since the micro-LED 270 is pressurized or pressed and attached onto the third insulating layer 260 by the transfer process, the third insulating layer 260 can be formed by coating a low viscosity material. First and second connection lines 274 and 276 respectively connecting the micro-LED 270 to the drain electrode 234 and the common voltage line 236 are formed on the third insulating layer 260. To prevent or reduce the disconnection of the first and second connection lines 274 and 276 by a step difference between the micro-LED 270 and the third insulating layer 260, a first region 262 of the third insulating layer 260 can have a relatively small height and a second region 264 of the third insulating layer 260 can have a relatively large height.

In the present invention, since the second insulating layer 250 can be formed to cover the lateral side of the micro-LED 270, a height of the second portion 264 of the third insulating layer 260 can be increased due to the thickness of the second insulating layer 250. Accordingly, the disconnection problem of the first and second connection lines 274 and 276 can be prevented or reduced. However, the second insulating layer 250 can be omitted.

The third insulating layer 260 includes an organic insulating material, e.g., photo-acryl, and a hydrophilicity changeable material of Formula 1. The hydrophilicity changeable material can be dispersed or mixed with the organic insulating material or coated on its surface. The third insulating layer 260 has a height difference and a property difference in the pixel region P.

When the hydrophilicity changeable material is coated, the third insulating layer 260 includes a base layer and a hydrophilicity changeable layer on the base layer. Namely, the base layer can be positioned between the first substrate 201 and the hydrophilicity changeable layer. The hydrophilicity of the hydrophilicity changeable layer is increased by the UV ray irradiation, and the hydrophilicity of the hydrophilicity changeable layer is decreased by visible-ray irradiation.

In the third insulating layer 260, the first region 262 corresponding to a center of the pixel region P has a first hydrophilicity and a first height from the first substrate 201, and the second region 264 corresponding to an edge of the pixel region P has a second hydrophilicity and a second height from the substrate 201. The second hydrophilicity is smaller than the first hydrophilicity, and the second height is greater than the first height.

The micro-LED 270 can be formed in the first region 262 of the third insulating layer 260. Namely, the micro-LED 270 can be formed in the first region 262, which has a relatively high hydrophilic property (low hydrophobic property) such that the adhesion strength between the micro-LED 270 and the third insulating layer 260 is improved. As a result, the separation problem of the micro-LED 270 is prevented or reduced. In addition, the micro-LED 270 can be formed in the first region 262, which has a relatively low height from the first substrate 201, such that the disconnection problem of the first and second connection lines 274 and 276 is also prevented or reduced.

The micro-LED 270 can include an anode and a cathode, which faces the anode, an active layer as an emitting part between the anode and the cathode, and a reflection plate 272 under the active layer. The light emitted from the active layer is reflected by the reflection plate 272 such that the optical efficiency of the micro-LED display device 200 is improved.

The reflection plate 272 can be a separation element from the anode or the cathode. Alternatively, the anode or the cathode can be formed of a reflective material to serve as the reflection plate 272.

The micro-LED 270 is connected to the drain electrode 234 of the TFT Tr through the first connection line 274, which is connected to the anode, and the common voltage line 236 through the second connection line 276, which is connected to the cathode.

Namely, the first and second connection lines 274 and 276 are disposed on the third insulating layer 260 and in the second region 264 of the third insulating layer 260. In addition, one end of the first connection line 274 is connected to the anode of the micro-LED 270, and the other end of the first connection line 274 is connected to the drain electrode 234 of the TFT Tr through the drain contact hole 266. One end of the second connection line 276 is connected to the cathode of the micro-LED 270, and the other end of the second connection line 276 is connected to the common voltage line 236 through the common contact hole 268.

Accordingly, the voltage of the data line is applied to the anode of the micro-LED 270 through the TFT Tr, and the voltage of the common voltage line 236 is applied to the cathode of the micro-LED 270. As a result, the emission of the micro-LED 270 is generated, and the micro-LED display device 200 provides an image.

As mentioned above, in the present invention, the micro-LED 270 is transferred onto the third insulating layer 260, where the hydrophilicity changeable material is coated or mixed, such that the transfer efficiency of the micro-LED 270 is improved. As a result, the production yield of the micro-LED display device 200 is improved, and the production cost of the micro-LED display device 200 is reduced.

In addition, since the first region 262 of the third insulating layer 260, where the micro-LED 270 is attached, has a high hydrophilicity (hydrophilic property), the adhesion strength between the micro-LED 270 and the third insulating layer 260 is improved and/or maintained. Accordingly, the separation or peel problem of the micro-LED 270 is prevented or reduced, and the production yield of the micro-LED display device 200 is further improved. The display quality of the micro-LED display device 200 is also improved.

FIGS. 7A to 7D are schematic cross-sectional views illustrating a fabricating process of the micro-LED display device according to the second example embodiment of FIG. 6.

Figure 7A:
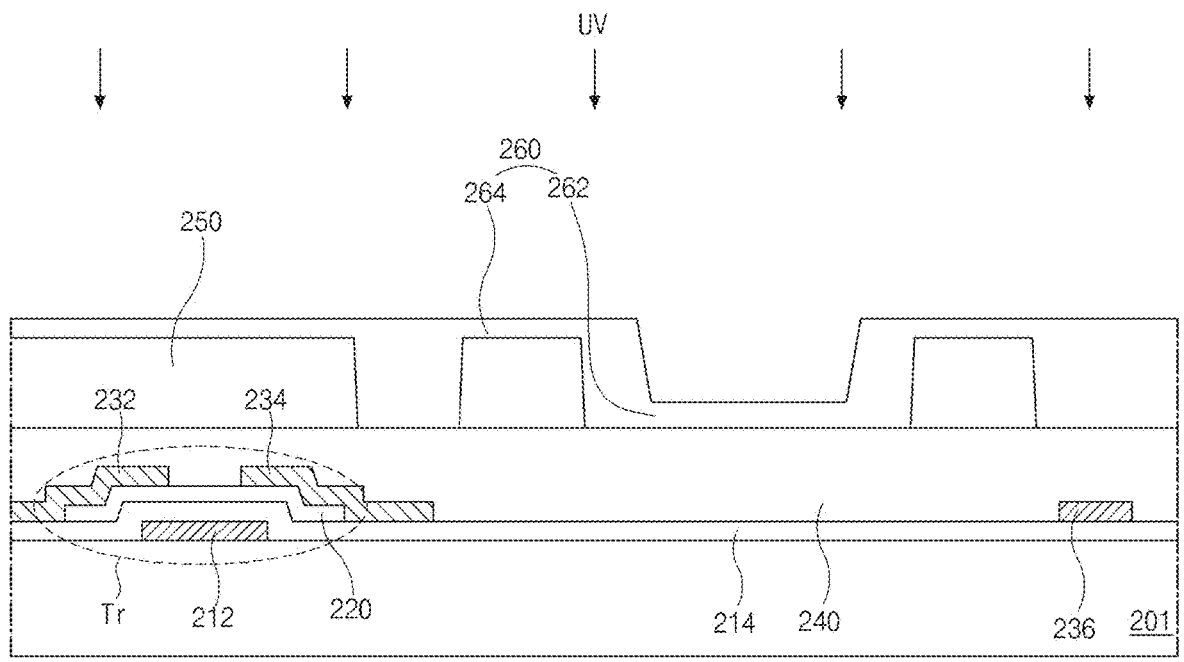

As shown in FIG. 7A, the TFT Tr, the common voltage line 236 and the first to third insulating layers 240, 250 and 260 are formed on the first substrate 201.

In more detail, a first metallic material can be coated on the first substrate 201, and a mask process can be performed to form the gate line 110 (of FIG. 1) and the gate electrode 212 connected to the gate line 110. For example, the first metallic material can be a low resistance material such as aluminum or copper. Other materials can be used.

Next, a gate insulation layer 214 can be formed over an entire surface of the first substrate 201 to cover the gate line 110 and the gate electrode 212. For example, the gate insulating layer 214 can be formed of an inorganic insulating material, e.g., silicon oxide or silicon nitride.

Next, a semiconductor layer 220 corresponding to the gate electrode 212 can be formed on the gate insulating layer 214. For example, the semiconductor layer 220 can be formed of an oxide semiconductor material. Alternatively, the semiconductor layer 220 can have a double-layered structure including an active layer of intrinsic amorphous silicon and an ohmic contact layer of an n-type impurity-doped amorphous silicon.

Next, a second metallic material can be coated on the first substrate 201, and a mask process can be performed to form the source electrode 232 and the drain electrode 234. In addition, the data line 130 (of FIG. 1), which is connected to the source electrode 232, and the common voltage line 236, which can be spaced apart from and parallel to the data line 130, are also formed on the gate insulating layer 214. For example, the second metallic material can be a low resistance material such as aluminum or copper. Other materials can be used.

The gate electrode 212, the semiconductor layer 220, the source electrode 232 and the drain electrode 234 constitute the TFT Tr.

Next, the first insulating layer 240 can be formed to cover the TFT Tr, the common voltage line 236 and the data line 130. For example, the first insulating layer 240 can be formed of an inorganic insulating material such as silicon oxide or silicon nitride.

Next, an organic insulating material, e.g., photo-acryl, can be coated on the first insulating layer, and the mask process can be performed to form the second insulating layer 250 surrounding a region where the micro-LED 270 will be formed.

Next, an organic insulating material, e.g., photo-acryl, can be coated to form the third insulating layer 260 covering the second insulating layer 240 and the first insulating layer 240. In this instance, the hydrophilicity changeable material of Formula 1 can be mixed with the organic insulating material or connected to the organic insulating material.

Alternatively, after a base layer can be formed by coating the organic insulating material such as photo-acryl, the hydrophilicity changeable material can be coated on the base layer to form the hydrophilicity changeable layer. In this instance, the third insulating layer 260 can have a double-layered structure of the base layer and the hydrophilicity changeable layer. The micro-LED 270 contacts the hydrophilicity changeable layer.

The third insulating layer 260 has a step difference (or height difference) due to the second insulating layer 250. As a result, the first region 262 of the third insulating layer 260 has a first height from the first substrate 201, and the second region 264 of the third insulating layer 260 has a second height, which can be greater than the first height, from the first substrate 201.

Next, the UV ray is irradiated onto the third insulating layer 260. The UV ray can have a wavelength of about 300 to 400 nm, and can be about 365 nm.

The third insulating layer 260, which includes the hydrophilicity changeable material or the hydrophilicity changeable layer, has a low hydrophilicity before the UV ray is irradiated. However, when the UV ray is irradiated, the pyran ring of the hydrophilicity changeable material is opened such that the hydrophilicity of the hydrophilicity changeable material is increased as explained with reference to FIG. 5.

Accordingly, after the UV ray irradiation process, both of the first and second regions 262 and 264 of the third insulating layer 260 have high hydrophilicity.

Figure 7B:
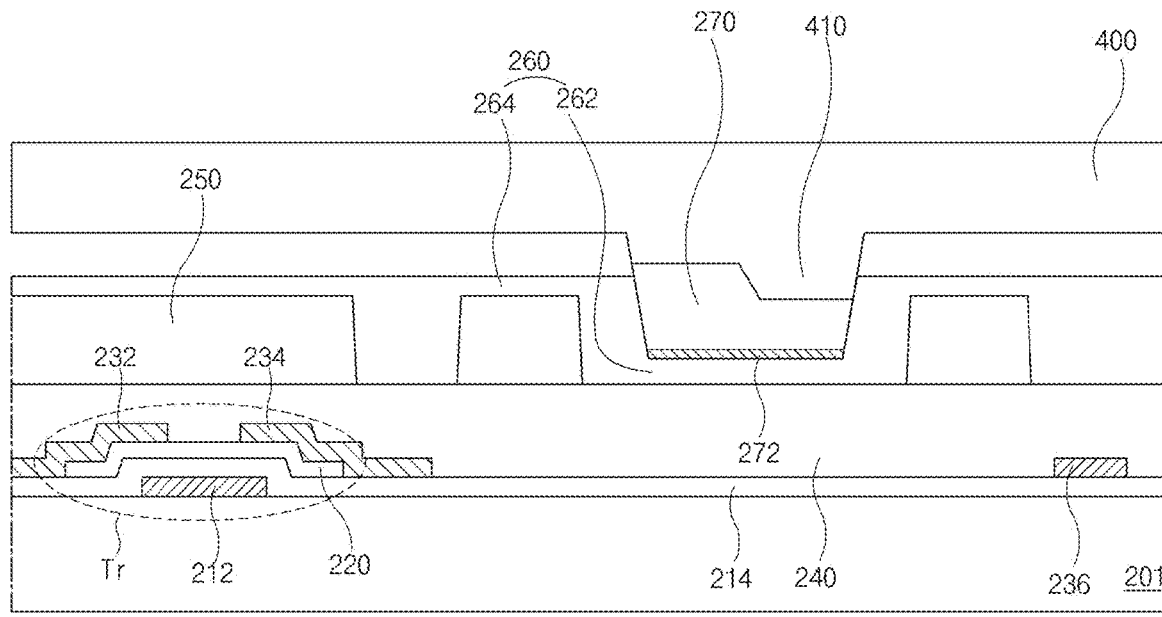

Next, as shown in FIG. 7B, by contacting the stamp 400, where the micro-LED 270 is transferred on the protrusion 410, with the substrate 201, where the third insulating layer 260 is formed, the micro-LED 270 is transferred to the third insulating layer 260. In this instance, operation of pressurizing the micro-LED 270 toward the third insulating layer 260 can be further performed.

As mentioned above, since the third insulating layer 260 has high hydrophilicity (hydrophilic property) by the UV ray irradiation, the micro-LED 270 and the third insulating layer 260 have high adhesion strength. Accordingly, the transfer efficiency of the micro-LED 270 to the third insulating layer 260 is improved.

Figure 7C:
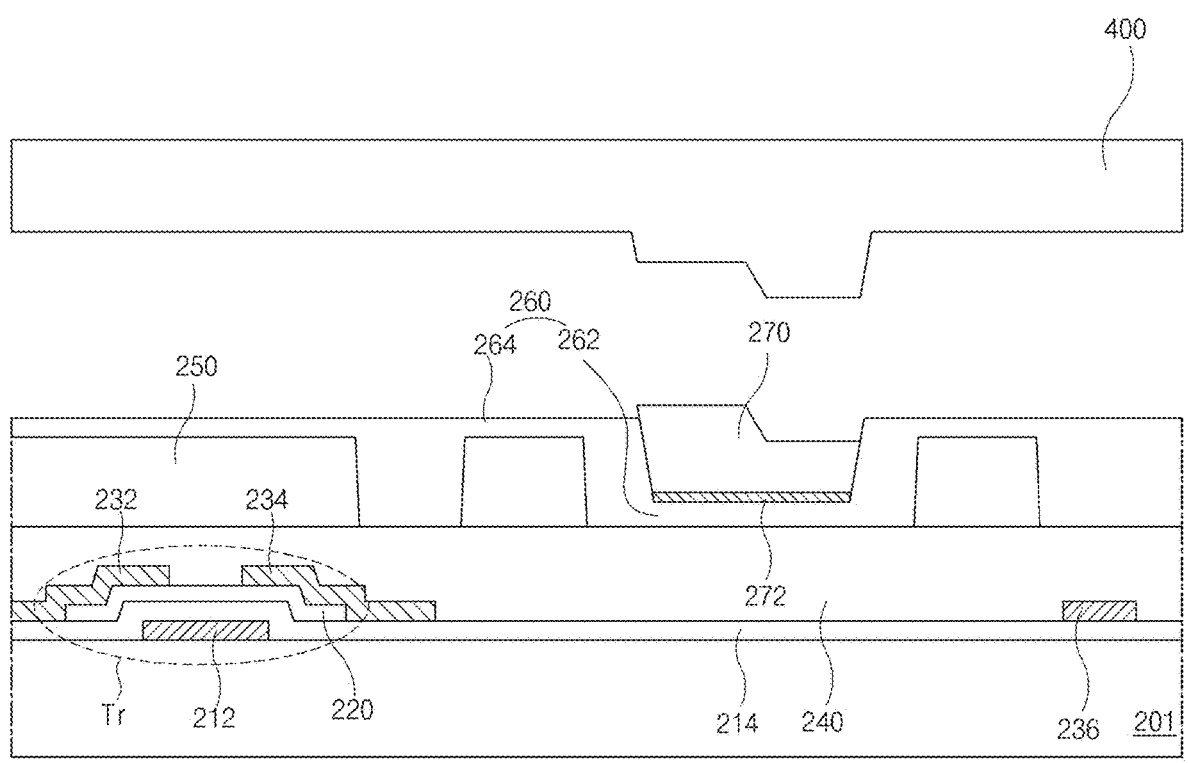

Next, as shown in FIG. 7C, the stamp 400 is separated or detached from the micro-LED 270. Since the micro-LED 270 and the third insulating layer 260 have high adhesion strength, the stamp 400 is easily or efficiently separated (or detached) from the micro-LED 270.

On the other hand, when the hydrophilicity changeable material is included in the stamp 400 or coated on the stamp 400 as described in the first embodiment, an operation of irradiating visible-ray can be performed between the operation of transferring the micro-LED 270 onto the third insulating layer 260 and the operation of separating the stamp 400 from the micro-LED 270 or can be simultaneously performed as the operation of separating the stamp 400 from the micro-LED 270.

Namely, when the UV ray is irradiated onto the stamp 400 in the operation of transferring the micro-LED 270 from the wafer 300 (of FIG. 3A) to the stamp 400, the visible-ray is irradiated onto the stamp 400 in the operation of separating the stamp 400 from the micro-LED 270 to decrease the hydrophilicity of the stamp 400. As a result, the adhesion strength between the stamp 400 and the micro-LED 270 is decreased, and the stamp 400 is easily or efficiently separated from the micro-LED 270.

In this instance, since the visible-ray is blocked by the reflection plate 272 (of FIG. 6) of the micro-LED 270, the hydrophilicity of the third insulating layer 260 is maintained. Namely, the second region 264 is exposed to the visible-ray such that the second region 264 has a first hydrophilicity being smaller than a second hydrophilicity of the first region 262.

On the other hand, the micro-LED display device 200 is exposed to outer (or external) visible-ray without the visible-ray irradiation operation. Since the visible-ray is also blocked by the reflection plate 272 of the micro-LED 270, the hydrophilicity of the second region 264 becomes smaller than the hydrophilicity of the first region 262.

In addition, the visible-ray emitted from the micro-LED 270 in the operation of the micro-LED display device 200 is also blocked by the reflection plate 272 of the micro-LED 270 such that the hydrophilicity of the first region 262 is maintained.

Accordingly, a pyran-ring opened compound (right side compound in FIG. 6) can be included in the first region 262, and a pyran-ring closed compound (left side compound in FIG. 6) can be included in the second region 264.

As mentioned above, since the first region 262 has high hydrophilicity, the separation of the micro-LED 270 from the third insulating layer 260 is prevented or reduced.

An insulating layer including a base layer of photo-acryl and a hydrophilicity changeable layer coated on the base layer is prepared, and the UV ray irradiation operation and the micro-LED transfer operation are performed. The hydrophilicity changeable material of Formula 2, where R4 can be a methacrylamide group, can be used. Water ($H_2O$) contact angle of the hydrophilicity changeable layer is measured and shown in Table 2 of FIG. 8. (5-point average contact angle) The contact angle in the first region is tested after the micro-LED is or removed.

As shown in Table 2, the contact angle in the first region, where the micro-LED is formed, is decreased by the UV ray irradiation, and the contact angle in the first region is maintained because the irradiation of the visible-ray to the first region is blocked by the reflection plate of the micro-LED. However, the second region, where the micro-LED is not formed, is exposed to the visible-ray such that the contact angle of the second region after the UV ray irradiation is similar to that in the initial state.

Namely, the hydrophilicity of the first region is increased by the UV ray irradiation such that the adhesion strength between the micro-LED to the first region is improved. In addition, since the visible-ray to the first region is blocked, the hydrophilicity of the first region is substantially maintained such that the adhesion strength between the micro-LED to the first region is substantially maintained.

Next, as shown in FIG. 7D, by performing a mask process to the first and third insulating layers 240 and 260, the drain contact hole 266 and the common contact hole 268 respectively exposing the drain electrode 234 and the common voltage line 236 are formed.

Next, a metallic material can be deposited on the third insulating layer 260, and a mask process can be performed to form the first and second connection lines 274 and 276 for connecting the micro-LED 270 to the drain electrode 234 and the common voltage line 236.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. A micro-light emitting diode (micro-LED) display device, comprising:
   a substrate;
   a first insulating layer on the substrate and including a first region and a second region; and
   a micro-LED on the first insulating layer and in the first region,
   wherein the first insulating layer in the first region has a first hydrophilicity, and the first insulating layer in the second region has a second hydrophilicity that is less than the first hydrophilicity.

2. The micro-LED display device according to claim 1, wherein the first insulating layer includes a hydrophilicity changeable material, and
   wherein a hydrophilicity of the hydrophilicity changeable material is increased by a UV ray, and the hydrophilicity of the hydrophilicity changeable material is decreased by a visible-ray.

3. The micro-LED display device according to claim 1, wherein the first insulating layer includes a base layer and a hydrophilicity changeable layer on the base layer, the hydrophilicity changeable layer including a hydrophilicity changeable material, and
   wherein a hydrophilicity of the hydrophilicity changeable material is increased by a UV ray, and the hydrophilicity of the hydrophilicity changeable material is decreased by a visible-ray.

4. The micro-LED display device according to claim 3, wherein the micro-LED contacts the hydrophilicity changeable layer.

5. The micro-LED display device according to claim 1, wherein the micro-LED includes an active layer and a reflection plate, and
   wherein the reflection plate is between the active layer and the first region of the first insulating layer.

6. The micro-LED display device according to claim 1, wherein the first region has a first height from the substrate, and the second region has a second height from the substrate, and
   wherein the second height is greater than the first height.

7. The micro-LED display device according to claim 6, wherein a thickness of the micro-LED is substantially equal to a difference between the first and second heights.

8. The micro-LED display device according to claim 1, further comprising:
   a thin film transistor on the substrate;
   a common voltage line on the substrate;
   a second insulating layer covering the thin film transistor and the common voltage line, and positioned between the substrate and the first insulating layer; and
   a third insulating layer positioned between the first and second insulating layers, and surrounding a lateral side of the micro-LED.

9. The micro-LED display device according to claim 8, further comprising:
   a first connection line and a second connection line on the first insulating layer,
   wherein a drain contact hole and a common contact hole respectively exposing a drain electrode of the thin film transistor and the common voltage line are formed through the first and second insulating layers,
   wherein one end of the first connection line is connected to the micro-LED, and another end of the first connection line is connected to the drain electrode through the drain contact hole, and
   wherein one end of the second connection line is connected to the micro-LED, and another end of the second connection line is connected to the common voltage line through the common contact hole.

10. A micro-light emitting diode (micro-LED) display device, comprising:
    a substrate;
    a first insulating layer on the substrate and including a first region and a second region; and
    a micro-LED in the first region,
    wherein the first region has a first hydrophilicity, and the second region has a second hydrophilicity that is less than the first hydrophilicity,
    wherein the first insulating layer includes a hydrophilicity changeable material, and
    wherein a hydrophilicity of the hydrophilicity changeable material is increased by a UV ray, and the hydrophilicity of the hydrophilicity changeable material is decreased by a visible-ray.

11. A micro-light emitting diode (micro-LED) display device, comprising:
    a substrate;
    a first insulating layer on the substrate and including a first region and a second region; and
    a micro-LED in the first region,
    wherein the first region has a first hydrophilicity, and the second region has a second hydrophilicity that is less than the first hydrophilicity,
    wherein the micro-LED includes an active layer and a reflection plate, and wherein the reflection plate is between the active layer and the first region of the first insulating layer.

* * * * *